(12) United States Patent
Schramme et al.

(10) Patent No.: US 10,132,907 B2
(45) Date of Patent: Nov. 20, 2018

(54) CALIBRATION OF CURRENT SENSORS BY MEANS OF REFERENCE CURRENT DURING CURRENT MEASUREMENT

(71) Applicants: Continental Teves AG & Co. oHG, Frankfurt (DE); Continental Automotive GmbH, Hannover (DE)

(72) Inventors: Martin Schramme, Königsbrunn (DE); Wolfgang Jöckel, Gersfeld (DE)

(73) Assignees: Continental Teves AG & Co. oHG, Frankfurt (DE); Continental Automotive GmbH, Hannover (DE)

( * ) Notice: Subject to any disclaimer, the term of this patent is extended or adjusted under 35 U.S.C. 154(b) by 0 days.

(21) Appl. No.: 15/505,216

(22) PCT Filed: Sep. 17, 2015

(86) PCT No.: PCT/EP2015/071355
§ 371 (c)(1),
(2) Date: Feb. 20, 2017

(87) PCT Pub. No.: WO2016/042091
PCT Pub. Date: Mar. 24, 2016

(65) Prior Publication Data
US 2017/0269184 A1 Sep. 21, 2017

(30) Foreign Application Priority Data
Sep. 17, 2014 (DE) .................. 10 2014 218 710
Apr. 30, 2015 (DE) .................. 10 2015 208 135

(51) Int. Cl.
*G09G 1/00* (2006.01)
*G01R 35/00* (2006.01)
(Continued)

(52) U.S. Cl.
CPC .......... *G01R 35/005* (2013.01); *G01R 1/203* (2013.01); *G01R 19/0092* (2013.01);
(Continued)

(58) Field of Classification Search
CPC ........ G09G 1/00; G09G 2230/00; G06F 1/00; G06F 2101/00; G11C 5/00; G11C 2207/00
See application file for complete search history.

(56) References Cited

U.S. PATENT DOCUMENTS 6,285,191 B1 *  9/2001  Gollomp .............. G01R 31/006
                                                                  324/427
8,552,588 B2   10/2013  Yang
(Continued)

FOREIGN PATENT DOCUMENTS

DE   19507959 C1   7/1996
DE   19801361 A1   2/1999
(Continued)

OTHER PUBLICATIONS

International Preliminary Report on Patentability for International Application No. PCT/EP2015/071355, dated Sep. 27, 2016, 6 pages.
(Continued)

*Primary Examiner* — Jermele M Hollington
*Assistant Examiner* — Temilade Rhodes-Vivour
(74) *Attorney, Agent, or Firm* — RatnerPrestia

(57) ABSTRACT

A method for calibrating a current sensor which is configured to determine, in a vehicle's onboard power system, an electric operating current which flows through a measuring resistor, based on comparison of a voltage drop at the measuring resistor caused by the operating current and based on a rule which is dependent on the measuring resistor, including: determining an operating voltage drop brought
(Continued)

about at the measuring resistor by the operating current; impressing a known electric calibration current into the measuring resistor, detecting an overall voltage drop brought about at the measuring resistor by the calibration current and the operating current, filtering the operating voltage drop from the overall voltage drop, such that a calibration voltage drop which is brought about by the calibration current remains, and calibrating the rule, dependent on the measuring resistor, based on the comparison of the calibration current and the calibration voltage drop.

9 Claims, 6 Drawing Sheets

(51) Int. Cl.
G01R 1/20 (2006.01)
G01R 27/16 (2006.01)
G01R 19/00 (2006.01)
G11C 5/00 (2006.01)
G06F 1/00 (2006.01)

(52) U.S. Cl.
CPC .............. *G01R 27/16* (2013.01); *G06F 1/00* (2013.01); *G09G 1/00* (2013.01); *G11C 5/00* (2013.01)

(56) References Cited

U.S. PATENT DOCUMENTS

| | | | |
|---|---|---|---|
| 8,582,266 B2* | 11/2013 | Bertin | G01R 35/005 361/93.8 |
| 9,239,342 B2 | 1/2016 | Jockel et al. | |
| 9,246,410 B2 | 1/2016 | Hirler et al. | |
| 2005/0148828 A1* | 7/2005 | Lindsay | A61B 5/00 600/300 |
| 2010/0141237 A1* | 6/2010 | Dietz | B60T 8/171 324/76.11 |
| 2013/0154672 A1 | 6/2013 | Fabregas et al. | |
| 2013/0249518 A1* | 9/2013 | Giannopoulos | H02M 3/156 323/284 |
| 2014/0253102 A1 | 9/2014 | Wood et al. | |
| 2014/0354266 A1* | 12/2014 | Hurwitz | G01R 19/0092 324/140 R |

FOREIGN PATENT DOCUMENTS

| | | |
|---|---|---|
| DE | 10229895 B3 | 4/2004 |
| DE | 102004062655 A1 | 7/2006 |
| DE | 102009044992 A1 | 4/2011 |
| DE | 202010015132 U1 | 6/2011 |
| DE | 102010028066 A1 | 10/2011 |
| DE | 102012006269 A1 | 10/2012 |
| DE | 102012105162 A1 | 12/2013 |
| DE | 102012014969 A1 | 1/2014 |
| EP | 2128633 A1 | 12/2009 |
| WO | 2013038176 A2 | 3/2013 |

OTHER PUBLICATIONS

International Search Report and Written Opinion for International Application No. PCT/EP2015/071355, dated Dec. 2, 2015, 9 pages.
International Preliminary Report on Patentability for International Application No. PCT/EP2015/071355, dated Sep. 27, 2016, 14 pages.
Korean Notice of Grounds for Rejection for Korean Application No. 10-2017-7007309, dated Apr. 26, 2018, including English translation, 12 pages.

* cited by examiner

CALIBRATION OF CURRENT SENSORS BY MEANS OF REFERENCE CURRENT DURING CURRENT MEASUREMENT

CROSS REFERENCE TO RELATED APPLICATIONS

This application is the U.S. National Phase Application of PCT International Application No. PCT/EP2015/071355, filed Sep. 17, 2015, which claims priority to German Patent Application No. 10 2015 208 135.4, filed Apr. 30, 2015 and German Patent Application No. 10 2014 218 710.9 filed Sep. 17, 2014, the contents of such applications being incorporated by reference herein.

FIELD OF THE INVENTION

The invention relates to a method for measuring a current using a current sensor.

BACKGROUND OF THE INVENTION

Electric currents in and from a vehicle battery are measured, for example in DE 10 2009 044 992 A1, which is incorporated by reference and in DE 10 2004 062 655 A1, which is incorporated by reference, with a current sensor using a measuring resistor, also called a shunt.

SUMMARY OF THE INVENTION

An aspect of the invention is an improvement over the known method for current measurement.

According to one aspect of the invention, a method for calibrating a current sensor that is set up to determine, in an onboard power supply system of a vehicle, an electric operating current flowing through a measuring resistor based on a comparison of a voltage drop across the measuring resistor brought about by the operating current and a rule dependent on the measuring resistor, comprises the steps of determination of an operating voltage drop brought about across the measuring resistor by the operating current; impression of a known electric calibration current into the measuring resistor, detection of a total voltage drop brought about across the measuring resistor by the calibration current and the operating current, filtering of the operating voltage drop from the total voltage drop, so that a calibration voltage drop brought about by the calibration current remains, and calibration of the rule dependent on the measuring resistor based on a comparison of the calibration current and the calibration voltage drop.

The specified method is based on the consideration that the measuring resistor, also called a shunt, is beset by tolerances. The measuring resistor should therefore be designed robustly with respect to these tolerances, which is accordingly expensive. Alternatively, a cheaper measuring resistor can also be used if the relevant tolerances can be detected and corrected. This could be accomplished by gauging and calibrating the measuring resistor using a known calibration current.

The measuring resistor should not have the unknown operating current applied to it during calibration. This is problematic insofar as it allows only long term dynamic tolerances to be taken into consideration, as arise as a result of the aging of the measuring resistor, for example. Short term dynamic tolerances, for example caused by temperature dependencies of the measuring resistor, cannot be taken into consideration in this way because they emerge only when the measuring resistor is operated under the applied operating current or the ambient temperature. For this reason, an accordingly expensive material needs to be chosen for the measuring resistor at least with respect to its short term dynamics.

This is the starting point for the specified method, with the proposal to first of all determine, during calibration, the operating voltage drop across the erroneous measuring resistor, which is consequently likewise erroneous. Subsequently, the erroneous measuring resistor subject to the operating current additionally has the calibration current applied to it and the resultant total voltage drop is tapped off. Finally, the total voltage drop has the erroneous operating voltage drop eliminated from it. This elimination also removes the error from the total voltage drop, so that the actual calibration voltage drop is then available, which can also be used to calibrate the current sensor during operation in order to suppress or cancel short term dynamic tolerances.

Therefore, short term dynamic tolerances can also be ignored when choosing the measuring resistor and an accordingly cheap material can be chosen therefore.

Expediently, the calibration current comprises a periodic current pulse.

In a development of the specified method, the calibration current is a current pulse having a pulse width, particularly of less than 10 µs. This development is based on the consideration that the calibration current should be detected as constantly as possible with few short term dynamic alterations, as are brought about by electrically contingent temperature alterations, for example. The shorter the current pulse is chosen, therefore, the more certainly the short term dynamic alterations can be masked out.

In one expedient development of the specified method, the operating voltage drop is determined by determining a characteristic variable for the operating voltage drop from at least two operating voltage measured values that are determined outside the current pulse. The characteristic variable is intended to be understood below to mean a value that characterizes the profile of an AC signal with respect to a particular physical property. Characteristic variables of this kind are mean values, RMS values, rectified values, and so on, for example. The development is based on the consideration that the operating voltage drop and the total voltage drop should actually be measured at common times so that the aforementioned error in the operating voltage drop can be eliminated from the total voltage drop as completely as possible. On the other hand, the operating voltage drop and the total voltage drop can, by their very nature, only be measured in succession. In order to resolve this contradiction, it is proposed as part of the present development to estimate the operating voltage drop during the applied current pulse and to estimate a suitable measured value for the operating voltage drop from the estimated operating voltage drop. This suitable measured value is described by the characteristic variable.

The estimation can be effected in this case using arbitrary means, for example by means of interpolation or extrapolation. The aforementioned estimation and determination of the characteristic variable can be realized in a technically particularly simple manner if the characteristic variable detected is the mean value between the two detected operating voltage measured values.

In a particular development of the specified method, the current pulse lies between the operating voltage measured values. In this way, a particularly small estimation error is achieved for estimation of the operating voltage drop, particularly for averaging.

In another development of the specified method, the total voltage drop and the operating voltage measured values are each converted into a digital value using at least one analog-to-digital converter and are each stored in a separate memory. The values stored in the memories are then all available in sync, so that the calibration voltage drop that is necessary for calibrating the current sensor is determinable using a simple arithmetic and logic unit.

In one development of the specified method, the total voltage drop and the operating voltage measured values are each converted using a separate analog-to-digital converter, wherein the analog-to-digital converters are interchanged with one another at intervals of time. The interchange of the individual analog-to-digital converters with one another achieves interleaving, as a result of which the error dependencies are evenly distributed over all measured values included in the calibration voltage drop.

In another development of the specified method, the total voltage drop and the operating voltage measured values are buffer-stored and each converted into a digital value at staggered times using a common analog-to-digital converter. In this way, not only is it possible to use a cheap single analog-to-digital converter for determining the calibration voltage drop, the use of a standard analog-to-digital converter also introduces a standard error dependency into the measured values included in the calibration voltage drop, said measured values then being able to be canceled out again computationally.

The method is developed by virtue of the total voltage drop brought about across the measuring resistor by the calibration current and the operating current being amplified by means of at least one amplifier stage, particularly before the filtering of the operating voltage drop from the total voltage drop is performed.

In one aspect the amplifier stage has at least one chopper circuit connected upstream of it that converts the signal from the total voltage drop into an AC signal, wherein particularly the polarity of the signal from the total voltage drop is periodically interchanged. As a particular preference in this case, the operation and/or clocking of the chopper circuit is designed such that within an interval of time, bounded by the times at which the two operating voltage measured values that are detected outside the current pulse are determined, no polarity change and/or period change for the chopper circuit is performed.

It is expedient that determination of the operating voltage drop from the total voltage drop involves a dechopper element being used, and particularly determination of the calibration voltage drop involves no dechopper element being used.

According to a further aspect of the invention, a control apparatus is set up to perform a method as claimed in one of the preceding claims.

In a development of the specified control apparatus, the specified apparatus has a memory and a processor. In this case, the specified method is stored in the memory in the form of a computer program and the processor is provided in order to carry out the method when the computer program is loaded from the memory into the processor.

According to a further aspect of the invention, a computer program comprises program code means in order to perform all the steps of one of the specified methods when the computer program is executed on a computer or one of the specified apparatuses.

According to a further aspect of the invention, a computer program product contains a program code that is stored on a computer-readable data storage medium and that, when executed on a data processing device, performs one of the specified methods.

According to another aspect of the invention, a current sensor for measuring an electric current comprises an electrical measuring resistor via which the electric current to be measured is routable to one of the specified control apparatuses.

According to another aspect of the invention, a vehicle comprises one of the specified control apparatuses and/or the specified current sensor.

BRIEF DESCRIPTION OF THE DRAWINGS

The properties, features and advantages of this invention that are described above and also the way in which they are achieved will become clearer and more distinctly comprehensible in connection with the following description of the exemplary embodiments, which are explained in more detail in connection with the drawings, in which.

DETAILED DESCRIPTION OF THE PREFERRED EMBODIMENTS

In the figures, like technical elements are provided with like reference symbols and described only once.

Figure 1:
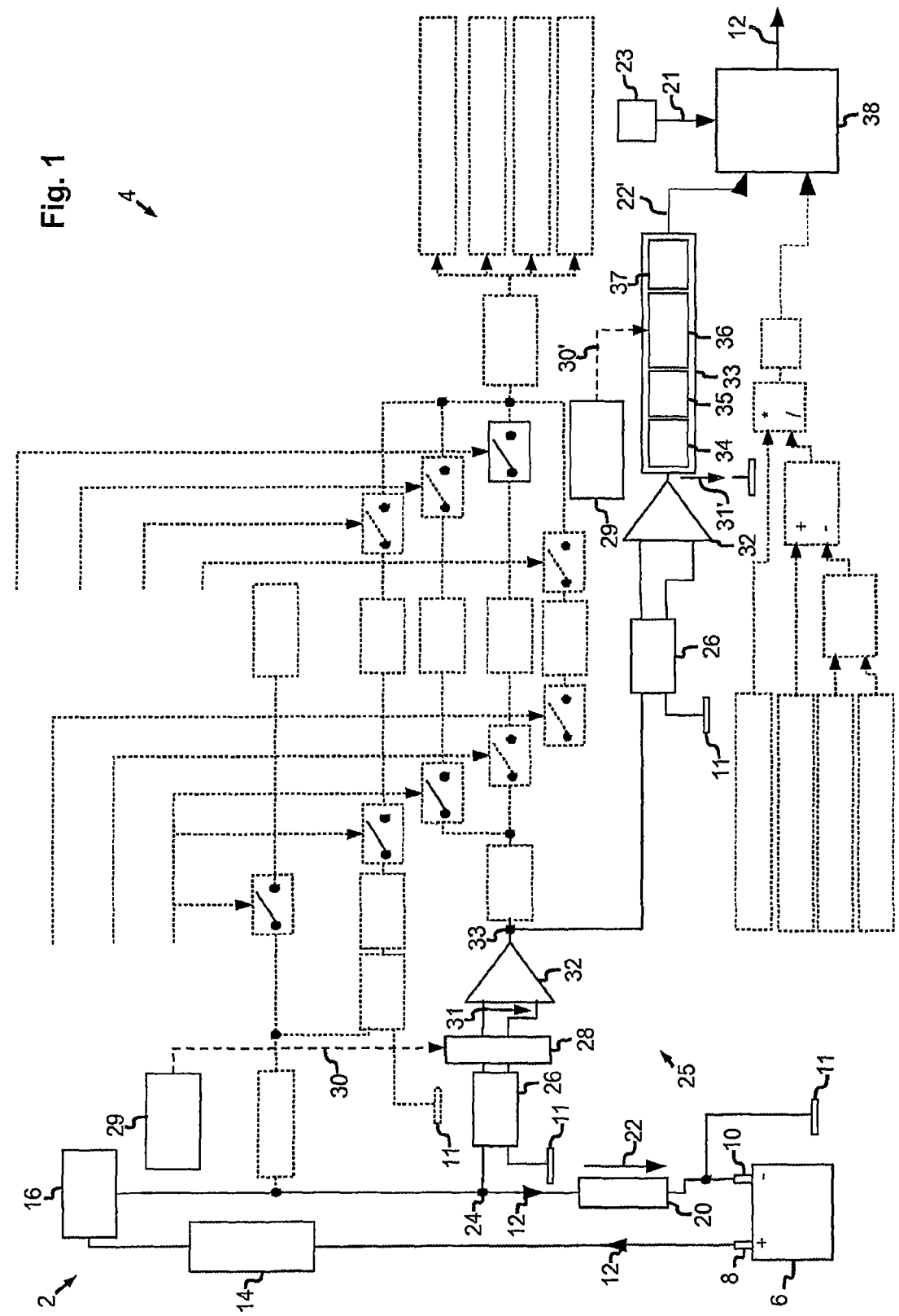
FIG. 1 shows a basic depiction of a current sensor connected to an onboard power supply system of a vehicle.

Reference is made to FIG. 1, which shows a basic depiction of a current sensor 4 connected to an onboard power supply system 2 of a vehicle, not depicted further. The lines depicted in finely dashed form are initially intended to be ignored in FIG. 1 in order to explain the operating principle of the current sensor 4 in more detail. The elements depicted in finely dashed form in FIG. 1 are therefore also not provided with a reference symbol.

The onboard power supply system 2 comprises a vehicle battery 6 having a positive pole 8 and a negative pole 10, which is connected to a reference-ground potential 11, such as ground. The vehicle battery 6 delivers, via the positive pole 8, an electric operating current 12 that supplies electric power to and thus operates various electrical loads 14 in the onboard power supply system 2. The operating current 12 is then returned to the negative pole 10. For practical reasons, this normally takes place via the chassis 16 of the vehicle.

The current sensor 4 is intended to detect the operating current 12 and to make it available to a processing computation device, such as a battery management system indicated in FIG. 1. The battery management system 18 is fundamentally a circuit that monitors the vehicle battery 6 and/or regulates the state of charge thereof. As such, various protection functions are implemented, one of which is known from DE 20 2010 015 132 U1, which is incorporated by reference and protects the vehicle battery 6 against deep discharge, for example.

For the purpose of detecting the operating current 12, the onboard power supply system 2 has a measuring resistor 20, also called a shunt, arranged in it. The operating current 16 flows through this measuring resistor 20 and thus ensures an operating voltage drop 22 across the measuring resistor 20. Fundamentally, the current sensor 2 detects the operating voltage drop 22 and takes the electrical properties of the measuring resistor 20 as the basis for determining the operating current 12 in a manner known per se. To this end, the measuring resistor 20 is expediently connected up directly to the reference-ground potential 11 at the negative pole 10, since in this way only a further potential tap 24 is necessary in order to detect the operating voltage drop 22.

To determine the operating current 12 based on the operating voltage drop 22, the current sensor 2 taps off the operating voltage drop 22 from the potential tap 24. This operating voltage drop 22 is normally so small that it is unusable for direct signal processing in order to determine the operating current 12. Therefore, the operating voltage drop 22 is initially amplified before the operating current 12 is determined.

To amplify the operating voltage drop 12, the current sensor 2 comprises an amplifier 25, which is of two stage design in the present embodiment. Fundamentally, a single-stage amplifier would suffice for determining the operating current 12. The amplifier 25 comprises a low pass filter 26 that taps off the operating voltage drop 22 from the potential tap 24 and filters undesirable signal components, such as switching transients, for example, therefrom. The low pass filtered operating voltage drop 22 tapped off is then converted into an AC signal using a chopper circuit 28. The chopper circuit takes a chopper signal 30 prescribed by a chopper controller 29 as a basis for separating the operating voltage drop 22 into signal periods and interchanges the polarity of single instances of these separated signal periods. In this way, an AC voltage 31 is produced from the operating voltage drop 22. Chopper circuits are known from DE 10 2012 105 162 A1, which is incorporated by reference, for example, and are not intended to be explained in more detail below. The task of the chopper circuit 28 is to eliminate an offset from a subsequent first amplifier stage 32 and second amplifier stage 32 routed via a further low pass filter 26. An intermediate tap 33 between the two amplifier stages 32 is discussed at a later juncture.

The amplified AC voltage 31' at the output of the second amplifier stage 32 is then finally digitized in a signal conditioning circuit 33 and converted into a digital operating DC voltage value 22'. To this end, the signal conditioning circuit 33 has an analog-to-digital converter, called an A/D converter 34, that converts the amplified AC voltage 31' into a digital signal, not shown. Subsequently, the resolution of the digitized amplified AC voltage 31' can be optionally increased in an input filter 35 if the resolution previously provided by the A/D converter 34 is inadequate. In any case, the digitized amplified AC voltage 31' is then converted back into an offset-containing AC voltage, not shown further, in a dechopper element 36. To this end, the digitized amplified AC voltage 31' is multiplied by −1 and +1 in the dechopper element 36 in the periods from the chopper controller 29 based on an inverted chopper signal 30'. As a result, the negative periods of the digitized amplified AC voltage 31' become positive or, to put it crudely, are "folded upward". As the two amplifier stages 32 amplify the AC voltage 31 with an offset, for technical reasons, the originally positive periods and the periods "folded upward" have a different amplitude, which is why this is an offset-containing AC voltage. This offset-containing AC voltage is then smoothed in a terminating filter 37 by averaging, as a result of which the offset introduced by the two amplifier stages 32 is canceled. From the signal conditioning circuit 33, the operating voltage drop 22 is thus output in digitized form, i.e. as a digital operating voltage drop 22'.

From the digital operating voltage drop 22', it is then possible, in a conversion device 38, for example using a characteristic curve 21 describing the physical properties of the measuring resistor 20 from a memory 23, to determine and output the operating current 12 to be measured. The conversion in the conversion device 38 can in this case take place based on known physical laws, such as Ohm's law, on the basis of the aforementioned physical properties 21 of the measuring resistor 20. A value for the operating voltage 22 is then assigned an explicit value for the operating current 12. However, this is the case only when the aforementioned electrical properties of the measuring resistor 20 and hence the characteristic curve 21 thereof are stable in the long and short terms. Normally, however, they change contingent on age, state and/or environment, for example. As such, ambient temperature is known to have an influence on electrical resistance. The material for the measuring resistor 20 must be chosen to be accordingly robust for all the aforementioned influences, this normally being possible only with very cost intensive materials.

This is intended to be the starting point for the present exemplary embodiment, as described with reference to FIG. 2, in which the elements from FIG. 1 that are depicted in finely dashed form are now depicted as normal elements and provided with a reference symbol.

The concept behind the present embodiment is to impress, during operation of the onboard power supply system 2 and hence the current sensor 4, a known reference current 40, also called calibration current, into the measuring resistor 20 from a reference current source 39, also called calibration current source, and to determine the actual physical properties of the measuring resistor 20 from the known reference current 40 and the voltage drop that can be tapped off from the output of the signal conditioning circuit 33, and in this way to correct the measurement result from the current sensor 4.

A fundamental obstacle to this idea, however, is that, during operation of the onboard power supply system 2, the operating current 12 also flows and thus has the reference current 40 superimposed on it. Hence, a total voltage drop 42 across the measuring resistor 20 that can be tapped off from the output of the signal conditioning circuit 33 is confronted not with a known reference current 40 but rather with a total current 41 from the operating current 12 and the reference current 40, so that the actual physical properties of the measuring resistor 20 are not ascertainable in this manner during operation.

So as still to make the actual physical properties of the measuring resistor 20 ascertainable based on the reference current 40, it is proposed as part of the present embodiment to eliminate an estimated operating voltage drop 22 from the total voltage drop 42. The operating voltage drop 22 during superimposition of the operating current 12 and the reference current 40 can be estimated with sufficient accuracy, which will be explained briefly with reference to FIG. 3 prior to further explanation of FIG. 2.

Figure 3:
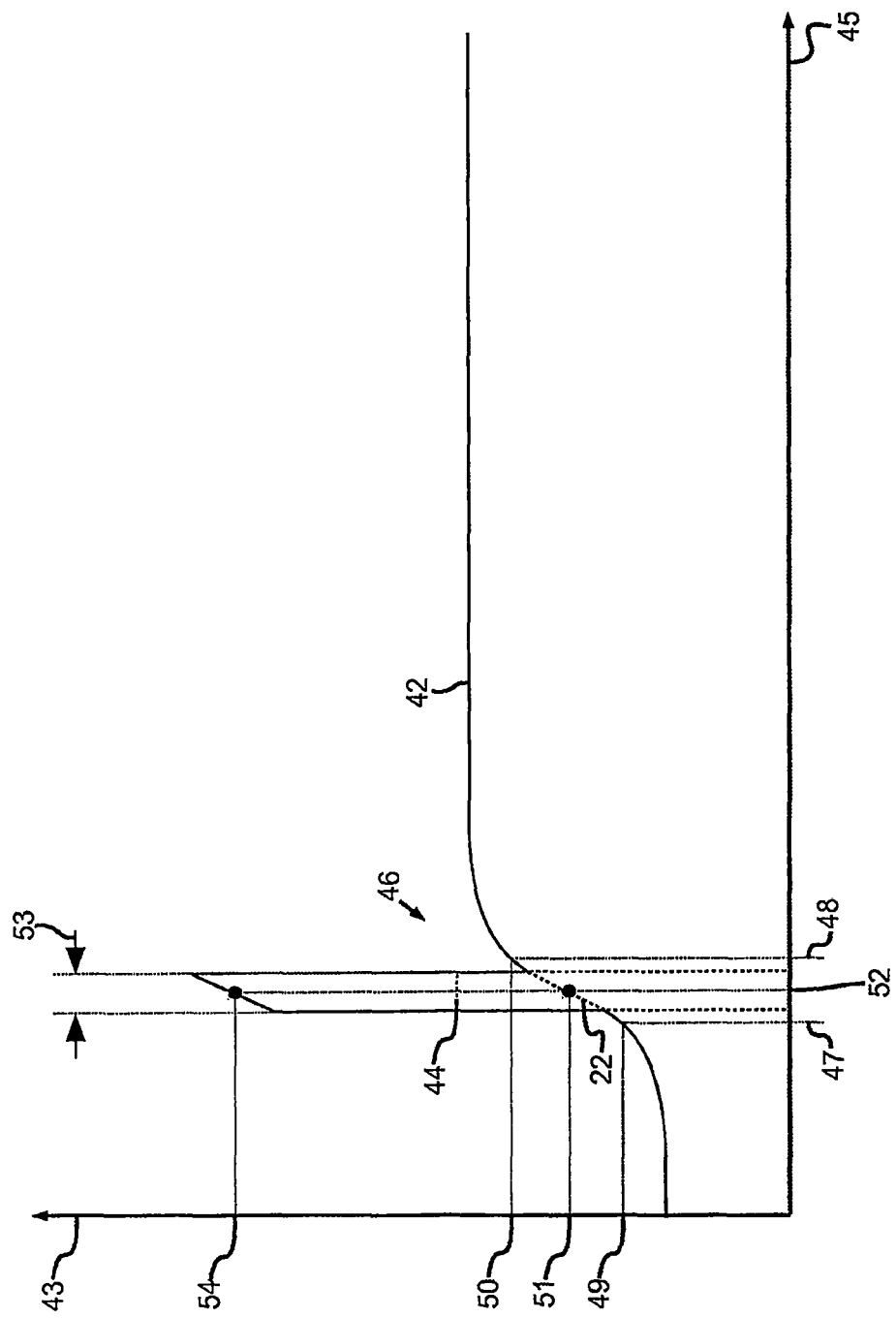
FIG. 3 shows a timing diagram with voltages dropped in the current sensor of FIG. 1.

In FIG. 3, voltage values 43 from the operating voltage drop 22 (without the action of the reference current 40), from a reference voltage drop 44 (without the action of the operating current 12), also called calibration voltage drop, and from the total voltage drop 42 are plotted over time 45. The profile of the operating voltage drop 22 and of the reference voltage drop 44, which profiles differ from the total voltage drop 42, are depicted in dotted form in FIG. 3. Further, FIG. 3 is intended to be understood on a purely qualitative basis, the actual ratios between the voltages not being reproduced.

To estimate the operating voltage drop 22, it is proposed that the reference current 40 be embodied in the form of a pulse, so that the reference voltage drop 44 also takes on the shape of a pulse 46 indicated in FIG. 3. As a continuous operating voltage drop 22 can be assumed, this should be estimated in temporal proximity to the pulse 46. To estimate the operating voltage drop 22, it is possible to use any desired method of estimation, including a Kalmann filter.

It is technically particularly simple and efficient to implement detecting a measured value 43, accordingly a first measured value 49 and a second measured value 50, for the operating voltage drop 22 at a first measurement time 47 in direct temporal proximity before the pulse 46 and at a second measurement time 48 in direct temporal proximity after the pulse. From the two measured values 49, 50, it is then possible to determine a mean value 51 that describes the operating voltage drop 22 in the centre 52 of the pulse 46 with sufficient tolerance.

The mean value 51 describes the actual voltage value 43 more accurately the more linear the profile of the operating voltage drop 22 in the region between the two measurement times 47, 48. Therefore, the pulse width 53 of the pulse 46 should be chosen to be as small as possible and restricted only by the boundaries of the signal processing. A useful pulse width 53 has been found to be less than 10 µs.

The mean value 51 at the middle time 52 can be used to detect the total measured value 54 for the total voltage drop 42 at the middle time 52 and to eliminate the operating voltage drop 22 from said total measured value, so that the reference voltage drop 44 brought about by the reference current 40 at the middle time 52 is known and can be used for calibrating the current sensor 4. In other words, in the present embodiment, all the necessary information for calibrating the current sensor 4 is available at the middle time 52.

The technical explanation of the calibration will now be explained further with reference to FIG. 2.

In the current sensor 4, the averaging between the measured values 49, 50 takes place in an averager 55 and the subtraction between the total measured value 54 and the mean value 51 to determine the reference voltage drop 44 takes place in a subtraction stage 56. Finally, in a division stage 57, the reference current 40 is compared with the reference voltage drop 44 by division, which results in a correction factor 58 as a basis for the correction, of the uncorrected operating current results. The correction factor 58 can, finally, optionally also be filtered using a filter element in the form of a demodulator 59, in order to smooth it. The demodulator 59 is based on the consideration that, considered over a comparatively long period of time, the operating current 12 is periodic because it is made up of a charging current flowing into the vehicle battery 6 and a discharge current flowing out of the vehicle battery 6. Since the capacity of the vehicle battery 6 is limited, the operating current 12 must therefore have a periodic profile and be equal to 0 on average, when considered over a long period of time. The demodulator 59 therefore considers any remaining component of operating current 12 in the correction factor 58 to be a carrier signal and filters it therefrom by means of averaging, analogously to demodulation (for example amplitude demodulation).

The filtered correction factor 58 is then supplied to the conversion device 38, which can correct the characteristic curve 20 for determining the operating current 20 based on the correction factor 58, for example.

The measured values 40, 50, 54, 59 needed for determining the correction factor 58 are stored in appropriate memories 60, 61, 62, 63. These memories 60, 61, 62, 63 are depicted twice in FIGS. 1 and 2 merely for the sake of clarity so that the signal paths do not cross. In fact, each memory is present only once.

To fill the memories 60, 61, 62, 63 and hence to initiate calibration, there are various control signals in the present exemplary embodiment. A reference current control signal 64 is used to close a switch 65, which conducts the reference current 40 via a reference resistor 66 to the measuring resistor 20. In principle, the reference resistor 66 is not necessary, because the method could be performed with the reference current source 39 alone. However, the demands on the reference current source 39 with respect to robustness and so on are then very high. Using the reference resistor 66, these demands can then be lowered, because the reference current 40 can be determined based on the electrical properties 67 of the reference resistor 66, which properties may be stored in an appropriate memory 68, and a corresponding voltage drop 69 across the reference resistor 66. The voltage drop 69 across the reference resistor 66 is, in this case, not the reference voltage drop 44 that is dropped across the measuring resistor 20 and is contained in the total voltage drop 42. In order to determine the voltage drop 69 across the reference resistor 66 as simply as possible, the reference resistor 66 should be chosen to be a multiple larger than the measuring resistor 20. Further, the reference current 40 should be chosen to be a multiple higher than the operating current 12. During normal operation, when the operating current 12 supplies electric power only to display elements as electrical loads 14, for example, said operating current is in the region of a few mA. It is then possible for the reference current 40 to be chosen to be in the region of one amp. In this way, the voltage drop 69 across the reference resistor 66 can be tapped off via a single tap point 70 with reference to the reference-ground potential 11, the total voltage drop 42 being able to be tapped off from the measuring resistor 20.

The voltage drop 69 across the reference resistor 66 is stored in a first buffer store 72 with the reference current control signal 64 via a further switch 65, a high pass filter 71 and a low pass filter 26 and can be tapped off again from said buffer store via a further switch 65. Further, the total measured value 54 for the total voltage drop 42 is also tapped off from the intermediate tap 33 with the reference current control signal 64 via a high pass filter 71 and stored in a second buffer store 73. The total voltage drop 42 is very high from the perspective of the high reference current 40. This is where the tap off from the intermediate tap 33 comes to fruition. In actual fact, the two amplifier stages 32 have to amplify a comparatively small operating voltage 22. The contrastingly high total voltage drop 42 would drive at least the second amplifier stage 32 to saturation and hence corrupt the measurement. Therefore, the total voltage drop 42 should be tapped off from the intermediate tap 33.

However, the intermediate tap 33 has the disadvantage that the relevant signals tapped off therefrom do not pass through the dechopper element 36. In order to overcome this disadvantage, it should be ensured that all measured values 49, 50, 54 tapped off from the intermediate tap 33 are tapped off in a pulse period of the chopper signal 30. The offset of the first amplifier stage 32 is then automatically canceled out when the correction factor 58 is determined. If the first measured value 49 is denoted by $U_0$, the middle 54 of the pulse 46 is denoted by $U_1$, the second measured value 50 is denoted by $U_2$, the reference current 40 is denoted by $I_{ref}$, the correction factor 58 is denoted by K and the offset of the first amplifier stage 32 is denoted by x, then the determination of the correction factor 58 according to FIG. 2 can be depicted by the following formula:

$$K = I_{ref} / [(U_1 + x) - \tfrac{1}{2}\{(U_D + x) + (U_2 + x)\}]$$

The offset of the first amplifier stage 32 is canceled out from this formula.

A first measured value control signal 74 can be used analogously to the total measured value 54 for the total voltage drop 42 to detect the first measured value 49 and to store it in a third buffer store 75, while a second measured value control signal 76 can be used to detect the second measured value 50 and to store it in a fourth buffer store 77.

The first buffer store 72 can then be read using a first read signal 78 via a switch 65, while the second buffer store 73 can be read using a second read signal 79 via a switch 65, the third buffer store 75 can be read using a third read signal 80 via a switch 65 and the fourth buffer store 77 can be read using a fourth read signal 81 via a switch 65.

Figure 2:
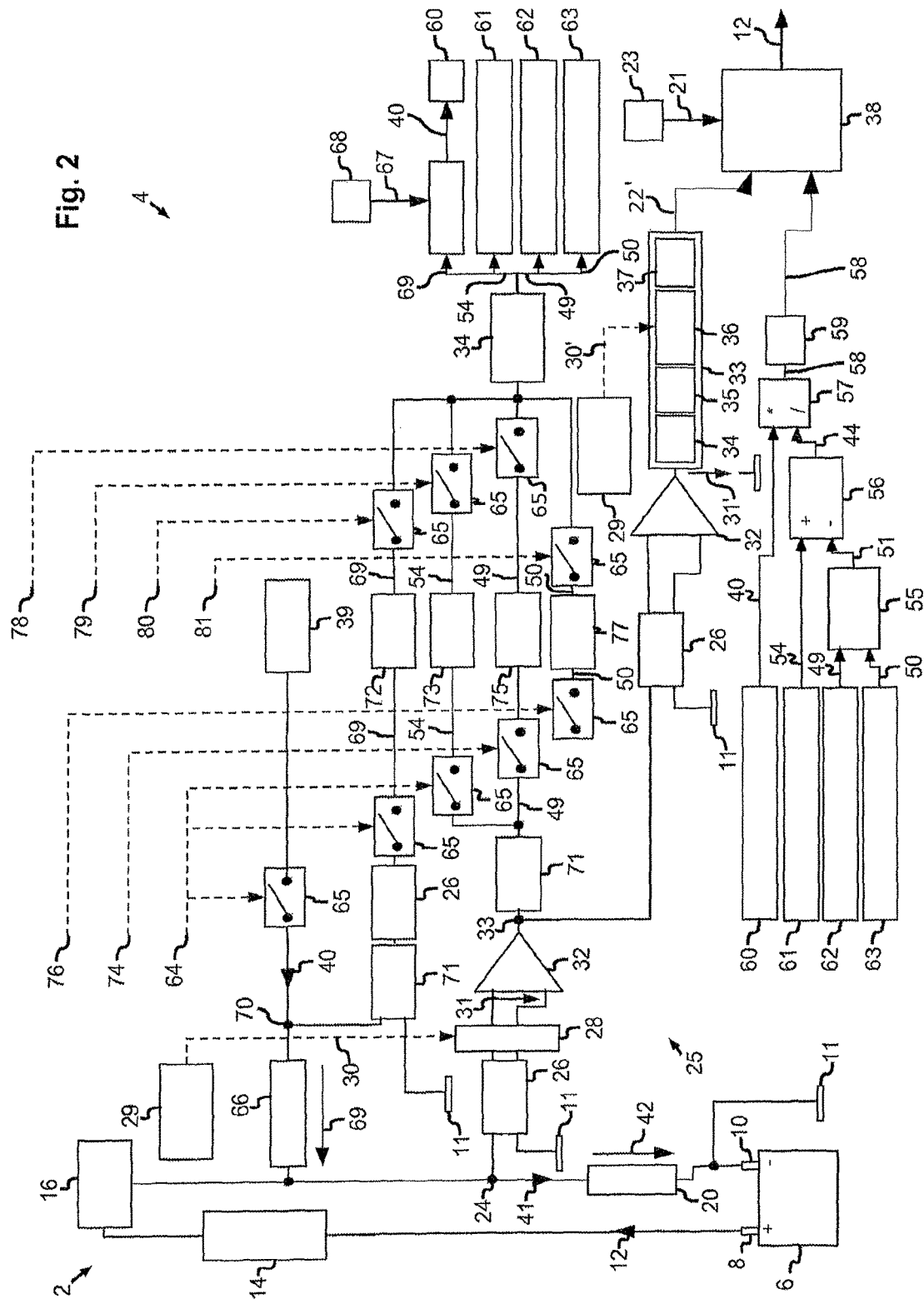
FIG. 2 shows the basic depiction from FIG. 1 with an alternative line choice.
Figure 4:
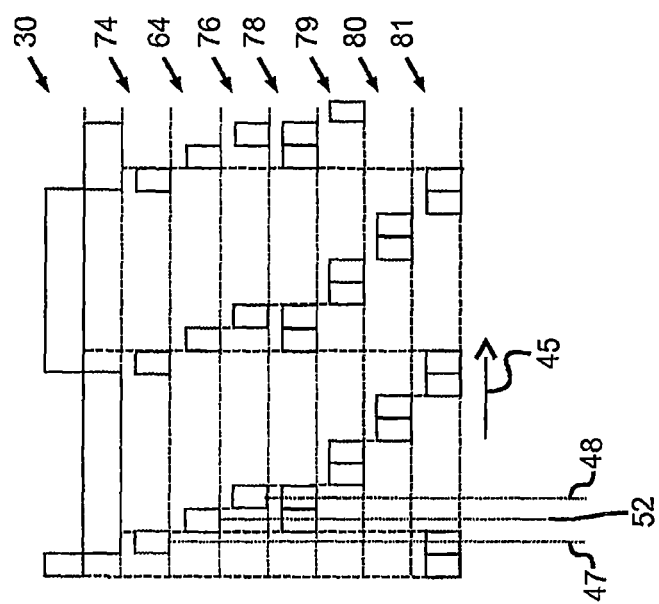
FIG. 4 shows a timing diagram with control signals for the current sensor from FIG. 1.

The control signals 30, 64, 74, 76, 78, 79, 80, 81 in FIGS. 1 and 2 are plotted over time 45 in FIG. 4.

As can be seen in FIG. 4, at the first measurement time 47, the first measured value 49 is first of all sampled with the first measured value signal 74 from the total voltage drop 42 using the relevant switch 65 and stored in the relevant buffer store 75. As soon as the first measured value 49 is present in the relevant buffer store 75, it is read using the first read signal 78 and stored in its memory 62 via an A/D converter 34.

During the actual reading of the buffer store 75 for the first measured value 49, the total measured value 54 itself for the total voltage drop 42 and also the voltage drop 69 across the reference resistor 66 are sampled in the middle 52 of the pulse 46 using the relevant switches 65 and are stored in the relevant buffer stores 72, 73. Subsequently, the buffer store 73 and the buffer store 72 are read in succession using the second read signal 79 and the third read signal 80, respectively. The sampled total measured value 54 for the total voltage drop 42 is stored in the relevant memory 61, while the voltage drop 69 across the reference resistor 66 is first of all converted into the reference current 40 based on the physical properties 67 of the reference resistor 66 before the reference current 40 determined in this manner is then stored in the relevant memory 60.

Following the sampling of the total measured value 54 for the total voltage drop 42 and of the voltage drop 69 across the reference resistor 66, the second measured value 50 is finally sampled with the second measured value signal 76 using the switch 65 at the second measurement time 48 and stored in the relevant buffer store 77. Reading of the buffer store 77 takes place analogously to the reading of the buffer store 73, but with the fourth read signal 81, the second measured value 50 being stored in the relevant memory 63.

In this way, all the measured values 40, 49, 50, 54 are present in the memories 60 to 63, so that the correction factor 58 can be determined according to FIG. 2.

The method and the embodiment of the current sensor 4 according to FIG. 2 have the advantage that digitization of the measured values 40, 49, 50, 54 requires only a single A/D converter 34, because the digitization of the measured values 40, 49, 50, 54 can be equalized by the temporal arrangement of the control signals according to FIG. 4. In this way, the digitization errors that are included at least in the measured values 49, 50, 54 by the A/D converter 34 involved in the digitization are also canceled out from the correction factor 58 analogously to the aforementioned offset of the first amplifier stage 32.

Figure 5:
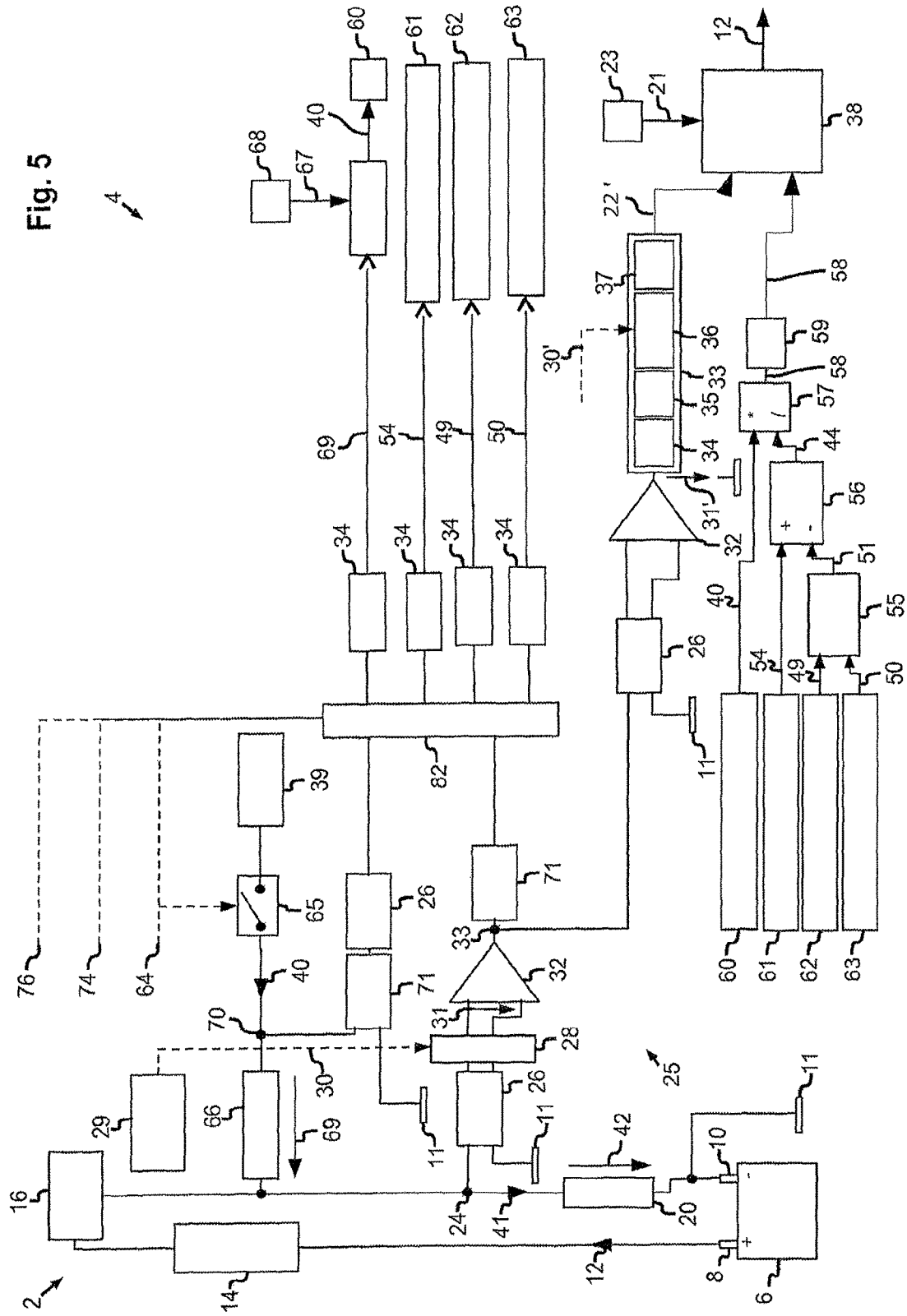
FIG. 5 shows a basic depiction of an alternative current sensor connected to an onboard power supply system of a vehicle.
Figure 6:
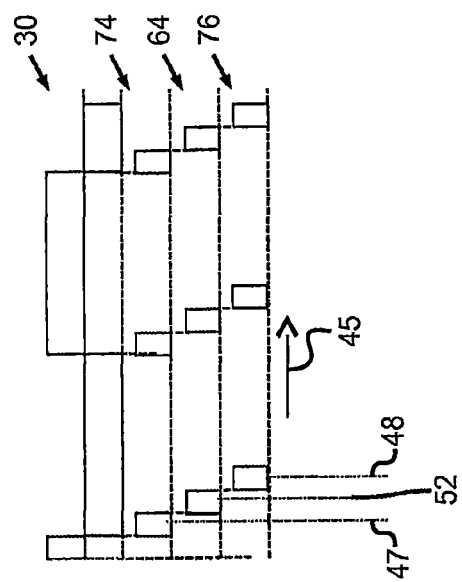
FIG. 6 shows a timing diagram with control signals for the current sensor from FIG. 3.

The comparatively high complexity of control signals can be reduced, however, using an alternative design of the current sensor 4 according to FIG. 5.

In this case, instead of the read signals 78 to 81, a multiplexer 82 is used. This is used to connect the relevant measured values 69, 54, 49, 50 directly to A/D converters 34 connected in parallel. This requires the A/D converters 34 to be designed to operate accordingly quickly, however.

The multiplexer 82 itself is not necessary. It is also possible to use switches 65, as shown in FIGS. 1 and 2. The multiplexer 82 can be used to rotate or interchange the individual A/D converters 34 during conversion of the measured values 69, 54, 49, 50, however, as a result of which different digitization errors from the individual A/D converters 34 are evenly distributed over the individual measured values 69, 54, 49, 50. In this way, the digitization errors are likewise canceled out during determination of the correction factor 58 analogously to the aforementioned offset of the first amplifier stage 32.

The invention claimed is:

1. A method for calibrating a current sensor that is set up to determine, in an onboard power supply system of a vehicle, an electric operating current flowing through a measuring resistor based on a comparison of a voltage drop across the measuring resistor brought about by the operating current and a rule dependent on the measuring resistor, comprising:
   determination of an operating voltage drop brought about across the measuring resistor by the operating current;
   impression of a known electric calibration current into the measuring resistor,
   detection of a total voltage drop brought about across the measuring resistor by the calibration current and the operating current,
   filtering of the operating voltage drop from the total voltage drop, so that a calibration voltage drop brought about by the calibration current remains, and
   calibration of the rule dependent on the measuring resistor based on a comparison of the calibration current and the calibration voltage drop,
   wherein:
   a) the calibration current is a current pulse having a pulse width,
   b) the operating voltage drop is detected by detecting at least two operating voltage measured values at at least two measurement times positioned on opposites sides of the current pulse, such that the current pulse lies between the operating voltage measured values, and
   c) at a middle time between the measurement times a mean value is formed between these at least two operating voltage measured values and used to determine the operating voltage drop for calibrating the current sensor, wherein the total voltage drop, the operating voltage drop and the calibration voltage drop are determined at the middle time.

2. The method as claimed in claim 1, wherein the total voltage drop and the operating voltage measured values are buffer-stored and each converted into a digital value at staggered times using a common analog-to-digital converter.

3. The method as claimed in claim 2, wherein a buffer store is provided for the total voltage drop and one buffer store is provided for each of the operating voltage measured values, and another measured value is stored in another buffer store during the actual reading of one of the buffer stores.

4. The method as claimed in claim 3, wherein the read signals for reading the buffer stores are longer than measured value signals for reading into the buffer store.

5. An apparatus that performs a method as claimed in claim 1.

6. A current sensor for measuring an electric current, comprising:
   an electrical measuring resistor via which the electric current to be measured is routable, and
   an apparatus as claimed in claim 5 for determining the electric current based on the operating voltage dropped across the electrical measuring resistor and the predetermined rule and for calibrating the rule.

7. A method for calibrating a current sensor that is set up to determine, in an onboard power supply system of a vehicle, an electric operating current flowing through a measuring resistor based on a comparison of a voltage drop across the measuring resistor brought about by the operating current and a rule dependent on the measuring resistor, comprising:
   determination of an operating voltage drop brought about across the measuring resistor by the operating current;
   impression of a known electric calibration current into the measuring resistor,
   detection of a total voltage drop brought about across the measuring resistor by the calibration current and the operating current,
   filtering of the operating voltage drop from the total voltage drop, so that a calibration voltage drop brought about by the calibration current remains, and
   calibration of the rule dependent on the measuring resistor based on a comparison of the calibration current and the calibration voltage drop,
   wherein:
   a) the calibration current is a current pulse having a pulse width,
   b) the operating voltage drop is detected by detecting at least two operating voltage measured values that lie outside the current pulse and the current pulse lies between the operating voltage measured values, and
   c) a mean value is formed between these at least two operating voltage measured values, and
   wherein the total voltage drop and the operating voltage measured values are each converted into a digital value using a separate analog-to-digital converter each and are each stored in a separate memory, the analog-to-digital converters being interchanged with one another at intervals of time.

8. A method for calibrating a current sensor that is set up to determine, in an onboard power supply system of a vehicle, an electric operating current flowing through a measuring resistor based on a comparison of a voltage drop across the measuring resistor brought about by the operating current and a rule dependent on the measuring resistor, comprising:
   determination of an operating voltage drop brought about across the measuring resistor by the operating current;
   impression of a known electric calibration current into the measuring resistor,
   detection of a total voltage drop brought about across the measuring resistor by the calibration current and the operating current,
   filtering of the operating voltage drop from the total voltage drop, so that a calibration voltage drop brought about by the calibration current remains, and
   calibration of the rule dependent on the measuring resistor based on a comparison of the calibration current and the calibration voltage drop,
   wherein:
   a) the calibration current is a current pulse having a pulse width,
   b) the operating voltage drop is detected by detecting at least two operating voltage measured values that lie outside the current pulse and the current pulse lies between the operating voltage measured values, and
   c) a mean value is formed between these at least two operating voltage measured values,
   wherein the total voltage drop brought about across the measuring resistor by the calibration current and the operating current is amplified by at least one amplifier stage,
   wherein the amplifier stage has at least one upstream chopper circuit that converts the signal from the total voltage drop into an AC signal, wherein the polarity of the signal from the total voltage drop is periodically interchanged, and
   wherein the operation and/or clocking of the chopper circuit is designed such that within an interval of time, bounded by the times at which the two operating voltage measured values that are detected outside the current pulse are determined, no polarity change and/or period change for the chopper circuit is performed.

9. The method as claimed in claim 8, wherein determination of the operating voltage drop from the total voltage drop involves using a dechopper element, and determination of the calibration voltage drop involves no dechopper element being used, but rather an intermediate tap is provided downstream of a first amplifier and all measured values tapped off from the intermediate tap are tapped off in a pulse period of the chopper signal.

* * * * *